United States Patent [19]

Aichert et al.

[11] 4,226,587
[45] Oct. 7, 1980

[54] HEATING SYSTEM FOR VACUUM COATING APPARATUS

[75] Inventors: Hans Aichert, Hanau am Main; Otto-Horst Hoffmann, Rodenbach; Friedrich Stark, Langenselbold; Herbert Stephan, Bruchköbel, all of Fed. Rep. of Germany

[73] Assignee: Leybold-Heraeus GmbH, Cologne, Fed. Rep. of Germany

[21] Appl. No.: 963,061

[22] Filed: Nov. 22, 1978

[30] Foreign Application Priority Data

May 10, 1978 [DE]  Fed. Rep. of Germany ....... 2820286

[51] Int. Cl.³ .............................................. F27B 9/14
[52] U.S. Cl. .................................... 432/122; 432/65; 432/226
[58] Field of Search ................. 432/65, 122, 205, 226

[56] References Cited

U.S. PATENT DOCUMENTS

| 3,342,469 | 9/1967 | Westeren | 432/65 |
| 3,622,135 | 11/1971 | Bauer et al. | 432/205 |
| 3,778,221 | 12/1973 | Bloom | 432/122 |
| 3,860,222 | 1/1975 | Tennenhouse | 432/205 |

Primary Examiner—John J. Camby
Attorney, Agent, or Firm—Sprung, Felfe, Horn, Lynch & Kramer

[57] ABSTRACT

Pass-through heating device for vacuum coating apparatus having a heating chamber with at least one heating device, a thermal barrier positioned between the walls of the heating chamber and the heating device parallel to the longitudinal axis of the coating apparatus.

4 Claims, 6 Drawing Figures

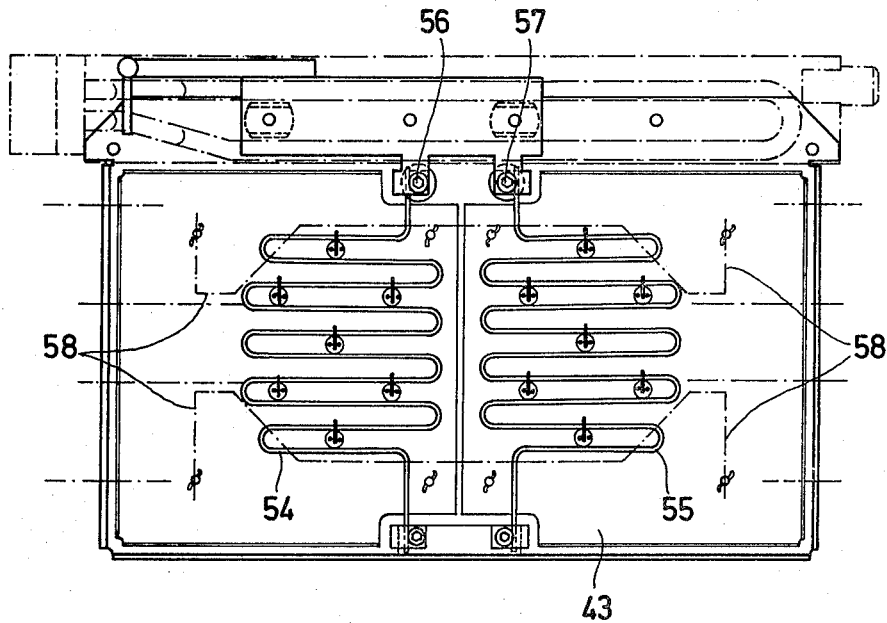
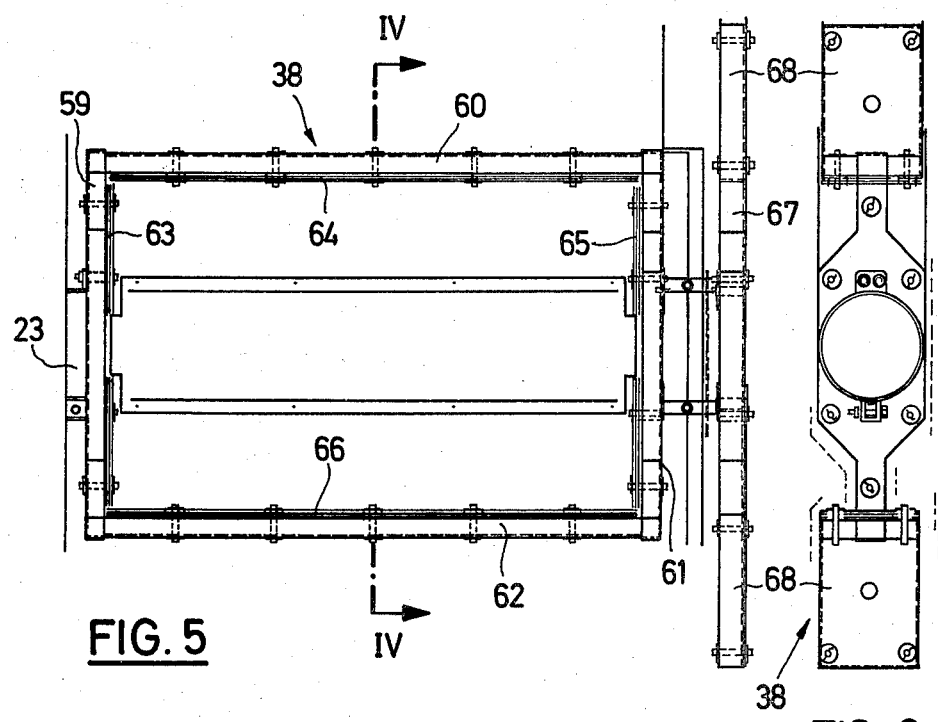

HEATING SYSTEM FOR VACUUM COATING APPARATUS

BACKGROUND

This invention relates to a pass-through heating system for discontinuous operation as an input to vapor coating apparatus, preferably for coating metal substrates, which includes a heating chamber having at least one heating means and a thermal barrier disposed between the heating chamber walls and the heating system, parallel to the direction in which the substrates are transported.

It is known to heat substrates to temperatures that are considerably higher than room temperature, for the purpose, for example, of bringing about intermetallic diffusion to increase the strength of adhesion between the base metal of the substrate and the vapor coating. In the application of oxidation and corrosion inhibiting surface coatings by vapor coating to gas turbine blades, temperatures between about 800° C. and 1100° C., preferably between 950° C. and 1000° C., have proven especially desirable whenever alloys of CoCrAlY and NiCoCrAlY, for example, are used in producing the surface coatings.

From German Pat. No. 19 41 254, it is known to provide for the heating of the substrates in the actual vapor coating chamber by installing heat sources by which the substrates can be heated to temperatures of about 980° C. Aside from the necessity of preventing the condensation of metal vapors on the heat sources themselves, this also ties up the vapor coating chamber for the duration of the heating cycle, thereby adversely affecting the economy of operation of the entire apparatus. Acceleration of the heating process by increasing the heating power is impossible because the propagation of heat into the substrates can take place only by thermal conduction, and excessively great heating power would entail the danger of local overheating.

It is also known to heat substrates in preheating chambers, in which case, however, the substrate temperatures have not exceeded maximums of about 300° to 400° C. For this reason, it has not been necessary to equip the preheating chambers with heat barriers making make them into virtually fully enclosed chambers. When the temperature level is so low, local "sinks" or sources of heat losses do not play the same important part they play at a high temperature level.

Whereas in general it is not at all difficult to bring a single substrate to a precisely predetermined temperature level if the heating time is sufficiently long, the difficulties increase substantially when a plurality of substrates are involved which are spread out in a plane for vapor coating and have to be heated at a uniformly high temperature level. The simultaneous coating of a plurality of substrates, however, is essential to the large-scale application of the coating processes involved. These are vacuum depositing processes, cathode spray processes, the chemical vapor deposition process, ion implantation, etc.

In the production of the oxidation and corrosion inhibiting coatings it has been found that a substrate temperature of, for example, 1000° C. must be maintained in all substrates with very great precision, i.e., within no more than ±10° C. To satisfy such requirements, it is known to provide pass-through heating with systems an appropriate length, i.e., about twice as long as the length of the substrates. Such an increase of length, however, has the disadvantage in the case of vacuum apparatus that it has to be doubled, because the transport rack that is provided for the substrate holder has to be made correspondingly longer. Since the transport rack has to be withdrawn into a lock chamber or loading chamber, it is necessary to make this chamber correspondingly longer, and this is the reason for the doubling of the structural length.

SUMMARY

This invention provides a pass-through heating system of the type described above, which makes it possible to bring a plurality of substrates to a uniform temperature level and nevertheless be of the shortest possible length so that the overall length of the entire apparatus is correspondingly reduced.

This is achieved in accordance with the invention in the pass-through heating device described in the beginning by associating movable thermal barriers with the heating chamber and disposing them at both ends thereof transverse to the direction of transport (the longitudinal axis of the coating apparatus). As soon as the substrates are within the heating system, the thermal barriers can be moved in front of the entrance and exit openings of the heating apparatus to serve as radiation-proof closures, so that a temperature drop towards the openings is at least largely prevented. The longitudinal dimension of the heating apparatus can consequently be greatly reduced, thereby also reducing the overall dimensions of the apparatus by about half. The reduction of the overall length is to be attributed substantially to the reduction of the length of the substrate rack. Since the substrate rack is supported entirely by the end of the transport shaft, the reduction of the length of the structure also reduces the cost of providing for the structural strength otherwise needed.

DESCRIPTION

The effect of the movable thermal barriers can be increased considerably also in accordance with the invention by mounting additional heating means on them. In this manner, the heating system when closed will have the effect of a fully enclosed heating chamber with heating devices distributed uniformly on its walls, so that the observed temperature differences will be even further reduced. It must be considered that unheated thermal barriers which are in the waiting position will first have to be heated by the thermal radiation of the heating means when they come into the operating position. By the additional provision of heaters on the thermal barriers, this can be avoided.

In a vacuum coating apparatus having a substrate rack which is mounted on a cantilevered transport shaft, when this transport shaft is in position for the coating of the substrates on the substrate rack, it is necessarily inside of the pass-through heating apparatus. It would be possible to prevent damage to the shaft from the radiant heat by forced cooling, but this would not only result in energy losses and in an irregular temperature distribution on account of the withdrawal of heat through the transport shaft, but the transport shaft itself also would interfere with the thorough closing of the heating apparatus. To eliminate this difficulty it is furthermore proposed to incorporate into the transport shaft a box-like frame by which the heating chamber can be substantially closed at the sides and at the ends, and that thermal barriers directed against the heating chamber be fastened on this frame. In this case, for as long as the substrate holder and substrates are inside of the coating chamber, the frame serves the same function as the thermal barriers throughout the coating process. Basically, it re-creates the fully closed heating apparatus.

The substrate rack generally has dimensions which are markedly greater than the dimensions of the area in which the substrates are disposed. This is necessary so that the substrate rack will not itself be directly exposed to the coating process or to any thermal radiation during the coating process. Care must be taken to assure that sensitive drive parts, for example for the movement of the substrates in the vapor stream, will not be situated in the vapor stream. Of course, the substrate rack should not be exposed to the effect of heat inside of the heating unit, either. To prevent this, the invention provides at least in one side wall of the heating apparatus parallel to the direction of pass-through having a slit-like aperture extending over its entire length, an unheated chamber disposed on the outside of the aperture and a side of the frame introducible into the aperture, substantially closing the latter. The position of the frame side (with its thermal barrier), the position of the slit-like opening and the geometrical shape of the unheated chamber are based on the dimensions of the substrate rack in that the latter is situated in the unheated chamber while the substrates are being heated. This provides extensive protection for the substrate rack as well as prevents heat losses through same.

An example of the embodiment of the invention will be explained with the aid of FIGS. 1 to 6.

Figure 2:
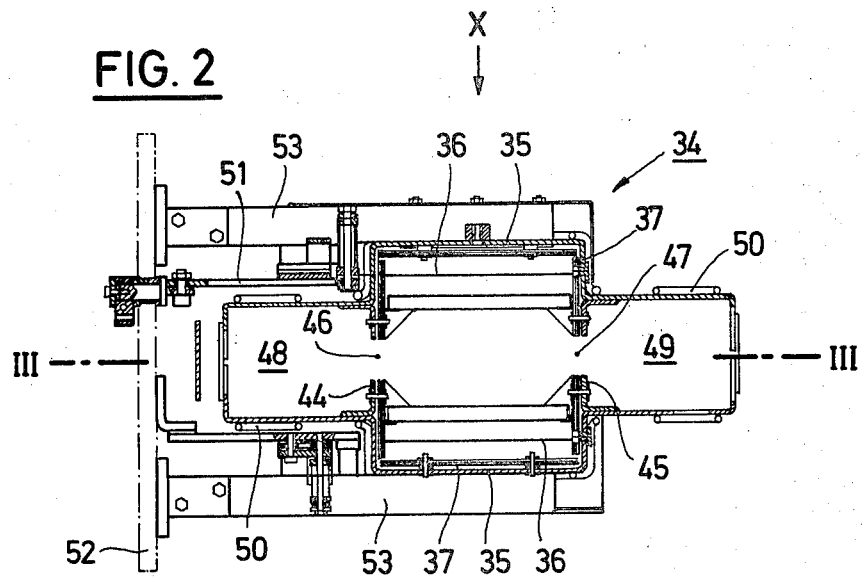
FIG. 2 is a vertical cross section taken along line II-II of FIG. 1.
Figure 3:
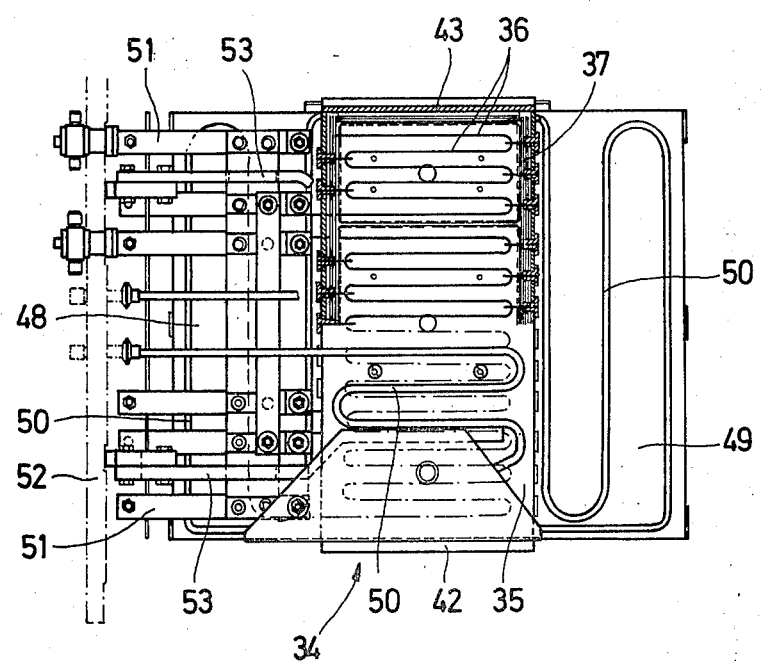

FIG. 3 in the lower half is a plan view taken in the direction of the arrow X and in the upper half it represents a horizontal cross section taken along line III-III of FIG. 2;

FIG. 4 is a top plan view of one of the movable thermal barriers as seen from the interior of the heating apparatus, FIG. 5 is a top plan view of the frame on the transport shaft, and FIG. 6 is a cross section taken along line VI-VI of FIG. 5.

Figure 1:
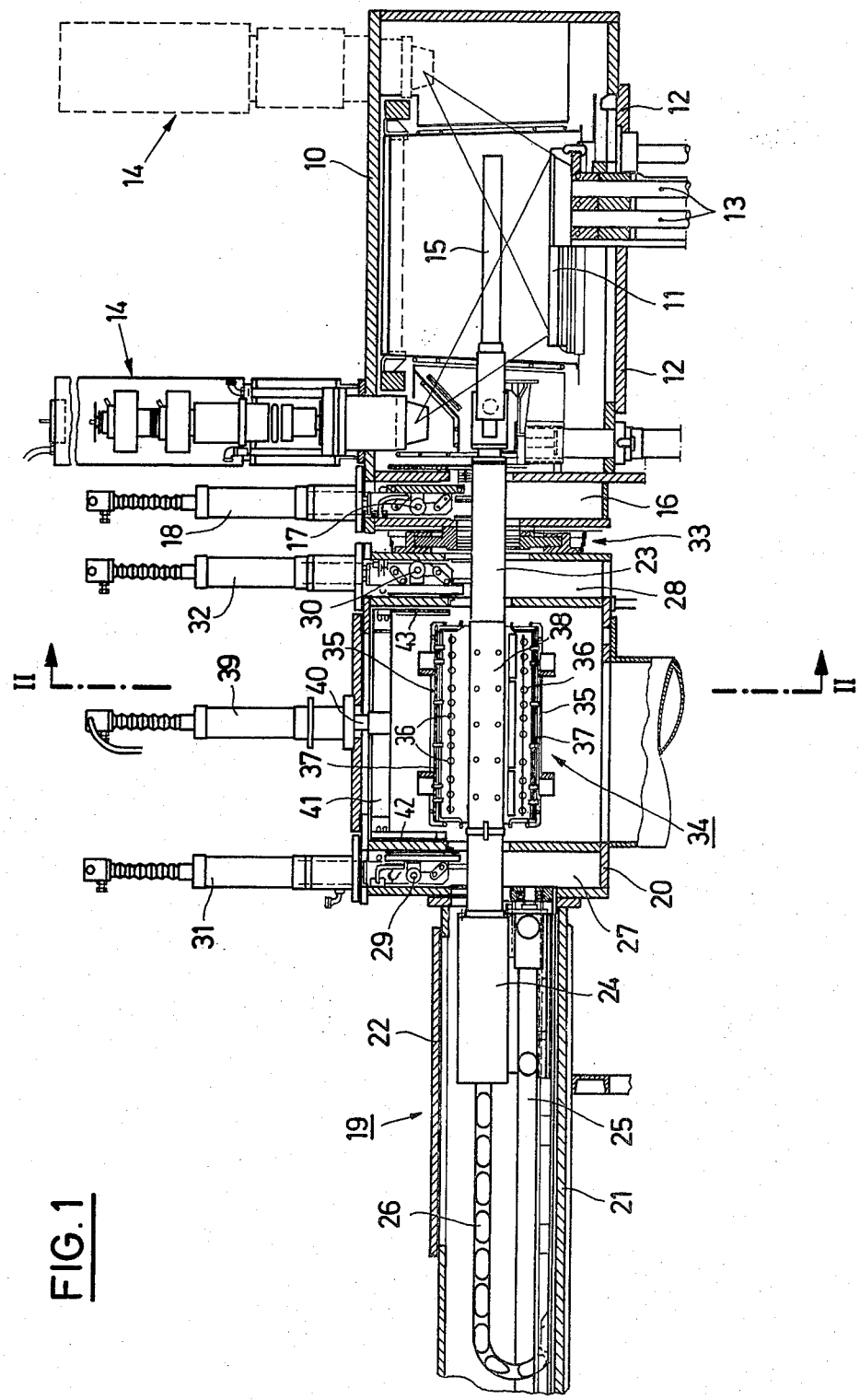
FIG. 1 represents a vertical cross section through the essential parts of a vacuum coating apparatus fed via a pass-through heating apparatus.

The vacuum coating apparatus of FIG. 1 includes a vacuum depositing chamber 10 containing a rectangular evaporating crucible 11 whose longest plane of symmetry coincides with the plane of section. The chamber 10 is closed on the bottom by a floor plate 12 which can be lowered together with the evaporating crucible 11 mounted thereon. The evaporating crucible is fed from the bottom with rods 13 of the alloy being evaporated, while the contents of the crucible are heated by electron beams produced by the electron guns 14. A plurality of substrates are fastened to a substrate rack 15 which is fork-shaped and extends along both sides of the evaporating crucible over its entire length. The substrates are thus in a planar arrangement above the evaporating crucible 11. The vacuum depositing chamber 10 is provided on the left side with a valve chamber 16 in which there is a shut-off valve 17 which can be operated by a valve actuator 18. The shut-off valve 17 is shown in the open position.

The vacuum depositing chamber 10 is fed by a feeder means 19 which is part of a pretreatment chamber 20. The feeder means 19 consists of a feeding chamber 21 provided with a lid 22 for the loading of the substrates into the substrate rack 15. To enable the substrate rack 15 to be brought into the area beneath the lid 22, the substrate rack 15 is connected by a transport shaft 23 to a carriage 24 which is guided on rails 25 running substantially parallel to the transport shaft 23. The drive mechanisms disposed on the carriage 24, which are not further indexed, are powered by a flexible cable system 26. The pretreatment chamber 20 is provided at both ends with valve chambers 27 and 28 in which are shut-off valves 29 and 30 which can be operated by valve actuators 31 and 32. The shut-off valves 29 and 30 are also shown in the open position for the passage of the transport shaft 23 through the pretreatment chamber. The valve chambers 16 and 28 are connected together by a releasable coupling valve 33.

In the pretreatment chamber 20 there is a pass-through heating means 34 which is constructed as a horizontal tunnel (FIG. 2) and includes a heating chamber 35 having an internal heating means 36 which is formed, for example, by a resistance heater of a resistance material having a high melting point. Between the heating means 36 and the heating chamber walls 35 are thermal barriers 37 made of packs of sheet metal. At both ends the heating chamber 35 are closed off to such an extent that the substrate rack 15 can just pass through the ends lengthwise. When the substrate rack 15 and the transport shaft 23 are in the position shown in FIG. 1, a frame 38, shown in FIGS. 5 and 6, which closes the heating chamber at the sides and at the ends in a substantially radiation-proof manner, is positioned within the heating chamber.

On the pretreatment chamber 20 there is disposed an actuating cylinder 39 whose plunger 40 passes through the roof of the pretreatment chamber and is fastened to a beam 41 disposed parallel to the transport shaft 23 above the heating chamber 35. The beam 41 has a length that is slightly greater than the length of the heating chamber 35. At the ends of the beam 41 are movable thermal barriers 42 and 43 one of which is shown in FIG. 4. The thermal barriers 42 and 43 extend transversely of the transport shaft 23 and are able to close, in a radiation-proof manner, the openings at the end of the heating chamber 35 as soon as the beam 41 is moved downward by an appropriate amount by means of the actuating cylinder 39.

It can be seen in FIGS. 2 and 3 that the heating chamber 35 has a substantially square cross section. In the two sidewalls 44 and 45 parallel to the transport direction there are slot-like apertures 46 and 47 extending over the entire length of the heating chamber 35. Unheated chambers 48 and 49, situated outside of the apertures 46 and 47, are provided with cooling coils 50. During the heating period, the two arms of the fork-like substrate rack 15 are positioned in the chambers 48 and 49, the substrates inside of heating chamber 35 being held by spacers (not shown) which extend through the apertures 46 and 47 into the interior of the heating chamber 35.

The electrical connections of the heating apparatus are provided by means of bus bars 51. The heating chamber 35 is supported on one chamber wall 52 by the supporting arms 53. The sealing action of the movable thermal barriers 42 and 43 in the closed state can be seen in FIG. 3.

In FIG. 4, the thermal barrier 43 is in the form of a rectangular plate on which two additional heating elements 54 and 55 are disposed, in the form of two meandering resistance wires connected in parallel. These are supplied with power through flexible conductors (not shown) and the terminals 56 and 57. In FIG. 4, the outlines 58 of the aperture for the passage of the substrate rack are indicated in broken lines to indicate how it approximates the configuration of the heating means 54 and 55.

The construction of the frame 38 is illustrated in FIGS. 5 and 6. The frame consists of four walls 59 to 62 joined together to form a torsion-resistant structure. On the insides are the thermal barriers 63 to 66 in the form of packs of sheet metal, which cover the entire interior surfaces of the walls. The arrangement is such that the walls 60 and 62 with the thermal barriers 64 and 66 are positioned in the openings 46 and 47 whenever the substrate rack 15 is in the position shown in FIG. 1. The frame 38 is adjoined by a radiation shield 67 whose ends 68 close the ends of the chambers 48 and 49 when the frame 38 is in the proper position.

What is claimed is:

1. In an elongated vacuum coating apparatus having a deposition chamber, the improvement comprising: a pass-through heating device comprising means including walls forming a heating chamber having an inlet and an outlet along the longitudinal axis of the vacuum coating apparatus, at least one heating means inside the heating chamber, means disposed parallel to the longitudinal axis of the vacuum coating apparatus and forming a thermal barrier between the heating means and the walls of heating chamber, movable means disposed transverse to the longitudinal axis of the vacuum coating apparatus for forming a thermal barrier at the inlet and the outlet of the heating chamber when a substrate is to be heated therein; a substrate rack; and transport means for moving the substrate rack along the longitudinal axis of the vacuum coating apparatus into the heating chamber for heating and therethrough into the deposition chamber for deposition comprising a cantilevered transport shaft having the substrate holder connected at one end thereof, a movable box-shaped frame disposed in the heating chamber and having a thermal barrier facing the interior of the heating chamber and means for moving the frame into a closing position in the heating chamber when the substrate holder is in the deposition chamber to substantially close the sides and ends of the heating chamber to prevent a decrease in temperature and loss of energy.

2. The apparatus according to claim 1, further comprising additional heating means disposed on the movable thermal barriers at the inlet and outlet of the heating chamber.

3. The apparatus according to claim 1, further comprising at least one unheated chamber disposed adjacent the sidewalls of the heating chamber parallel to the longitudinal axis of the vacuum coating apparatus and comprising means forming a slot-like opening in the sidewalls extending over the entire length thereof and wherein the frame closes the opening when disposed in the closing position thereof.

4. The apparatus according to claim 1, wherein the box-shaped frame is symetrically disposed with respect to the longitudinal axis of the transport shaft.

* * * * *